(12) United States Patent
Guidash

(10) Patent No.: US 6,365,926 B1
(45) Date of Patent: Apr. 2, 2002

(54) CMOS ACTIVE PIXEL WITH SCAVENGING DIODE

(75) Inventor: Robert M. Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/666,619

(22) Filed: Sep. 20, 2000

(51) Int. Cl.[7] ................ H01L 31/062; H01L 31/113
(52) U.S. Cl. ........................ 257/292; 257/291
(58) Field of Search .................. 257/232, 233, 257/291, 292, 369

(56) References Cited

U.S. PATENT DOCUMENTS

| | | | |
|---|---|---|---|
| 5,471,515 A | 11/1995 | Fossum et al. | 377/60 |
| 5,587,596 A | 12/1996 | Chi et al. | 257/223 |
| 5,608,243 A | 3/1997 | Chi et al. | 257/249 |
| 5,625,210 A | 4/1997 | Lee et al. | 257/292 |
| 5,631,704 A | 5/1997 | Dickinson et al. | 348/308 |
| 5,721,425 A | 2/1998 | Merrill | 250/214.1 |
| 5,760,458 A | 6/1998 | Bergemont et al. | 257/588 |
| 5,789,774 A | 8/1998 | Merrill | 257/292 |
| 5,838,650 A | 11/1998 | Campbell et al. | 369/103 |
| 5,841,159 A * | 11/1998 | Lee et al. | 257/291 |
| 5,841,176 A | 11/1998 | Merrill | 257/446 |
| 5,847,422 A | 12/1998 | Chi et al. | 257/291 |
| 5,859,450 A | 1/1999 | Clark et al. | 257/233 |
| 5,892,253 A | 4/1999 | Merrill | 257/292 |
| 5,970,316 A | 10/1999 | Merrill | 438/57 |
| 5,995,163 A | 11/1999 | Fossum | 348/572 |
| 6,005,619 A | 12/1999 | Fossum | 348/315 |
| 6,008,486 A | 12/1999 | Stam et al. | 250/208.1 |
| 6,051,447 A * | 4/2000 | Lee et al. | 438/48 |
| 6,160,281 A * | 12/2000 | Guidash | 257/292 |
| 6,160,282 A * | 12/2000 | Merrill | 257/292 |
| 6,259,124 B1 * | 7/2001 | Guidash | 257/292 |

OTHER PUBLICATIONS

FA 11.1: A 1/4 Inch 330k Square Pixel Progressive Scan CMOS Active Pixel Image Sensor, E. Oba et al., ISSC97/Session 11/Imaging Circuits and Systems/Paper FA11, pp. 180–189 and 452–454.
Technology and Device Scaling Considerations for CMOS Imagers, H. Wong, IEEE Transactions On Electron Devices, vol. 43, No. 12, Dec. 1996, pp. 2131–2142.
A Small Pixel CMD Image Sensor, M. Ogata et al., IEEE Transactions On Electron Devices, vol. 38, No. 5, May 1991, pp. 1005–1010.
A 250,000—Pixel Image Sensor With FET Amplification at Each Pixel for High–Speed Television Cameras, F. Andoh et al., ISSC90/Session 13/Image Sensors, Processors, and Displays, pp. 212–213 and 298.
An 800K–Pixel Color CMOS Sensor for Consumer Still Cameras, J. Hurwitz et al., VLSI Visions, Ltd.—1997/Feb. 1997/pp. 1–10.

* cited by examiner

Primary Examiner—Ngân V. Ngô
(74) Attorney, Agent, or Firm—Peyton C. Watkins

(57) ABSTRACT

A method and structure of a camera includes an array of pixels making up a complementary metal oxide semiconductor active pixel image sensor. At least one of the pixels includes a photodetector, a voltage source for supplying voltage to the photodetector, and a scavenging diode adjacent the photodetector that can be connected to the voltage source. The scavenging diode is positioned between adjacent ones of the pixels and prevents electrons outside the photodetector from migrating to the photodetector.

26 Claims, 4 Drawing Sheets

CMOS ACTIVE PIXEL WITH SCAVENGING DIODE

FIELD OF THE INVENTION

The present invention generally relates to CMOS active pixel photodetectors and more particularly to an improved CMOS active pixel photodetector array which includes scavenging diodes between adjacent photodetectors, which prevents cross-talk between adjacent photodetectors, and prevents diffusion of thermally generated electrons from isolation regions into the photodetectors.

BACKGROUND OF THE INVENTION

To overcome the limitations of CCD-based imaging circuits, more recent imaging circuits use complementary metal oxide semiconductors (CMOS) active pixel sensor (APS) cells to convert a pixel of light energy into an electrical signal. With active pixel sensor cells, a conventional photodiode is typically combined with a number of active transistors which, in addition to forming an electrical signal, provide amplification, readout control, and reset control.

FIG. 1 (from U.S. Pat. No. 5,970,316, incorporated herein by reference) is a schematic diagram that illustrates a conventional CMOS active pixel sensor cell 10. As shown in FIG. 1, the cell 10 includes a photodiode 12, a reset transistor 14 whose source is connected to photodiode 12, a source-follower transistor 16 whose gate is connected to photodiode 12, and a row-select transistor 18 whose drain is connected in series to the source of source-follower transistor 16.

Operation of active pixel sensor cell 10 is performed in three steps: a reset step, where cell 10 is reset from the previous integration cycle; an image integration step, where the light energy is collected and converted into an electrical signal; and a signal readout step, where the signal is read out.

As shown in FIG. 1, during the reset step, the gate of reset transistor 14 is briefly pulsed with a reset voltage $V_R$ (5 volts). The reset voltage $V_R$ turns on reset transistor 14 which pulls up the voltage on photodiode 12 and the gate of source-follower transistor 16 to an initial reset voltage. The initial reset voltage placed on the gate of source-follower transistor 16 also defines an initial intermediate voltage on the source of source-follower transistor 16 which is one threshold voltage drop less than the initial transfer voltage. Immediately after the gate of reset transistor 14 has been pulsed, the gate of row-select transistor 18 is pulsed with a row-select voltage $V_{RS}$. The row-select voltage $V_{RS}$ on the gate of row-select transistor 18 causes the initial intermediate voltage on the source of source-follower transistor 16 to appear on the source of row-select transistor 18 as an initial integration voltage which, in turn, is read out and stored by an imaging system.

During integration, light energy, in the form of photons, strikes photodiode 12, thereby creating a number of electron-hole pairs. Photodiode 12 is designed to limit recombination between the newly formed electron-hole pairs. As a result, the photo-generated holes are attracted to the ground terminal of photodiode 12, while the photo-generated electrons are attracted to the positive terminal of photodiode 12 where each additional electron reduces the voltage on photodiode 12. Thus, at the end of the integration step, the potential on photodiode 12 and the gate of source-follower transistor 16 will have been reduced to a final integration voltage where the amount of the reduction represents the intensity of the received light energy. As above, the final integration voltage on the gate of source-follower transistor 16 defines a final intermediate voltage on the source of source-follower transistor 16.

Following the image integration period, the final intermediate voltage on the source of source-follower transistor 16 is then read out as a final integration voltage by again pulsing the gate of row-select transistor 18 with the row-select voltage $V_{RS}$. As a result, a collected voltage which represents the total charge collected by cell 10 can be determined by subtracting the final integration voltage from the initial reset voltage.

FIG. 2 is a schematic top view of an active pixel 10. The cell 10, is preferably formed upon a p-type substrate. The photodiode 12 preferably comprises a lightly doped n-type region within the p-type substrate. In FIG. 2, the gate of the row select transistor 18 is shown as item 23. Similarly, the gate of the reset transistor 14 is shown as the reset gate 26. The gate of the source-follower transistor 16 is shown as item 20. The source (voltage supply, VDD) for the cell is shown as item 21.

FIGS. 3 and 4 illustrate an array of such cells 10. More specifically, FIG. 4 is a top view similar to FIG. 2 and FIG. 3 is a cross-sectional view along line A–A'. Such an array suffers from the disadvantage of color cross-talk. More specifically, as shown in FIG. 3, photoelectrons 30 produced by photons which naturally land between the cells 10 in the isolation region 31 have a tendency to migrate toward adjacent photodetectors 12. In the case of a color image sensor, where a color filter array pattern is used in conjunction with the pixel array, photons which have passed through a first pixel with a first color can impinge on the isolation region in between the first and second pixels and produce photoelectrons which end up in the photodetector of the second adjacent pixel. Since the signal integrated in the second adjacent pixel is ideally desired to represent the amount of photons passing through a second color filter above that pixel, any photoelectrons that reach the second photodetector that were created by photons passing through the first color filter cause color mixing or color cross-talk. Accurate representation of color image requires minimal color mixing. If substantial color mixing or cross-talk occurs, this will produce a hue shift in the resulting processed color image, and degrade color fidelity.

Color cross-talk or color mixing can also occur if photoelectrons bloom from the first pixel and flow over the isolation region into the second adjacent pixel. This can occur if the incident light of the first pixel is bright enough to completely fill the first photodetector, so that excess photoelectrons are created. These excess photoelectrons can then spill or bloom from the first pixel, traverse the isolation region 31 and be collected in the photodetector of the second adjacent pixel or pixels. This produces photoelectrons generated by photons associated with a first color being collected in a pixel or photodetector associated with a second color.

The direction of this cross-talk or color mixing will depend on the exact physical structure and layout of the pixel. In the case of the pixel array shown in FIG. 4, the mixing or cross-talk in the vertical direction is low due to the large space between photodiodes, and the effective drain of photoelectrons through the n+-substrate diode of the voltage supply 21. To the contrary, cross-talk in the horizontal direction is high due to the lack of a light shield to keep photoelectrons away from the pixel boundaries and the small isolation area/space 31 between adjacent photodiodes.

Isolation regions 31 are also typically areas that have a high thermal generation rate of electrons, typically referred to as dark current. These thermally generated electrons can diffuse or migrate from the isolation regions into adjacent photodetectors. These dark current electrons are then mixed with and read out with the photo-generated electrons. Since the thermally generated electrons are not associated with the incident optical signal, they are referred to as noise electrons, and degrade the signal to noise ratio performance of the pixel and image sensor.

Therefore, there is a need for a structure which removes photo-generated or thermally generated electrons which are created in the isolation area 31, before they can migrate to the photodetectors 12.

SUMMARY OF THE INVENTION

It is, therefore, an object of the present invention to provide a camera/imaging system having a complementary metal oxide semiconductor active pixel image sensor, comprised of an array of pixels, where each of the pixels includes a photodetector, a voltage source for supplying voltage to the photodetector, and a scavenging diode adjacent the photodetector. The scavenging diode can be connected to the voltage source of the circuit or a different voltage source. The scavenging diodes are positioned between adjacent photodetectors of the active pixel image sensor and prevent electrons generated within the isolation regions outside of the photodetector from migrating to the photodetector, and also prevent photoelectron that bloom from one photodetector from migrating to an adjacent photodetector.

The photodetector is positioned adjacent to the sides and top of each of the pixels and the pixels further include circuitry components positioned below the photodetector, wherein the scavenging diode is positioned along at least one of the sides of the pixels. The scavenging diode can bisect the isolation region between adjacent photodetectors or can be positioned below the isolation region to economize chip area. The scavenging diode is positioned at least between adjacent photodetectors in adjacent pixels. The voltage source and the scavenging diode can comprise a continuous active area region.

The pixels further include circuitry components positioned below the photodetector, wherein the scavenging diode is positioned along the sides, and the circuitry components form an effective scavenging diode below the photodetector.

ADVANTAGEOUS AFFECTS OF THE INVENTION

The invention supplies a scavenging diode which removes photo-generated and thermally generated electrons from the isolation region between adjacent photodetectors. The invention further prevents electrons that are photo-generated within one photodetector from blooming into adjacent photodetectors. Therefore, the adjacent photodetectors primarily collect photoelectrons which actually land upon the photodetectors and do not substantially collect photoelectrons which land adjacent to the photodetectors. Also, with the invention, photo-generated electrons from a first highly illuminated photodetector cannot spill from the first photodetector and migrated to (and be collected by) adjacent photodetectors. This allows for more accurate measurement of the level of photoelectrons received in the area defined by each photodetector, and reduces color channel mixing. This prevention or reduction of color cross-talk improves the color image quality or color fidelity that can be produced by the image sensor.

In addition, the invention inhibits thermally generated electrons in isolation regions surrounding the photodetectors from migrating to and being collected in the photodetectors. This improves the signal to noise ratio of the image sensor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Figure 1:
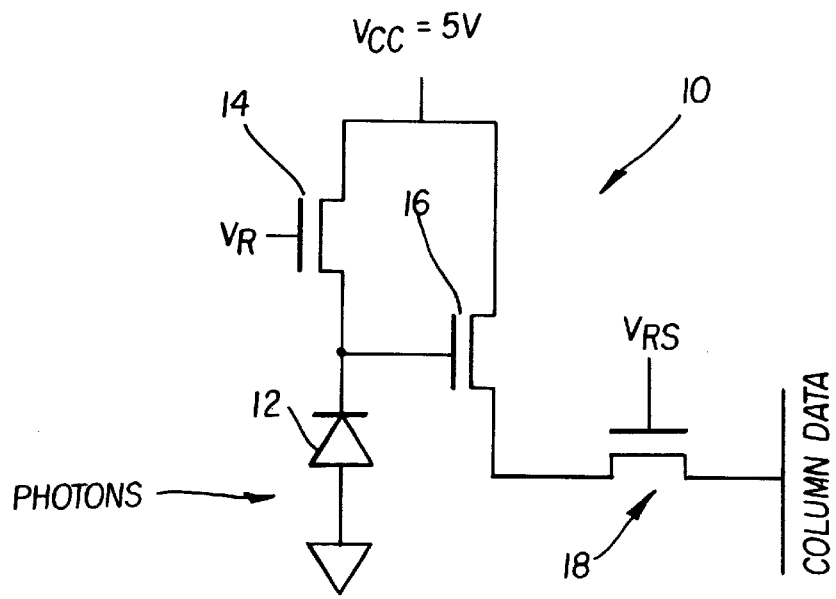
FIG. 1 is a schematic diagram of a pixel.
Figure 2:
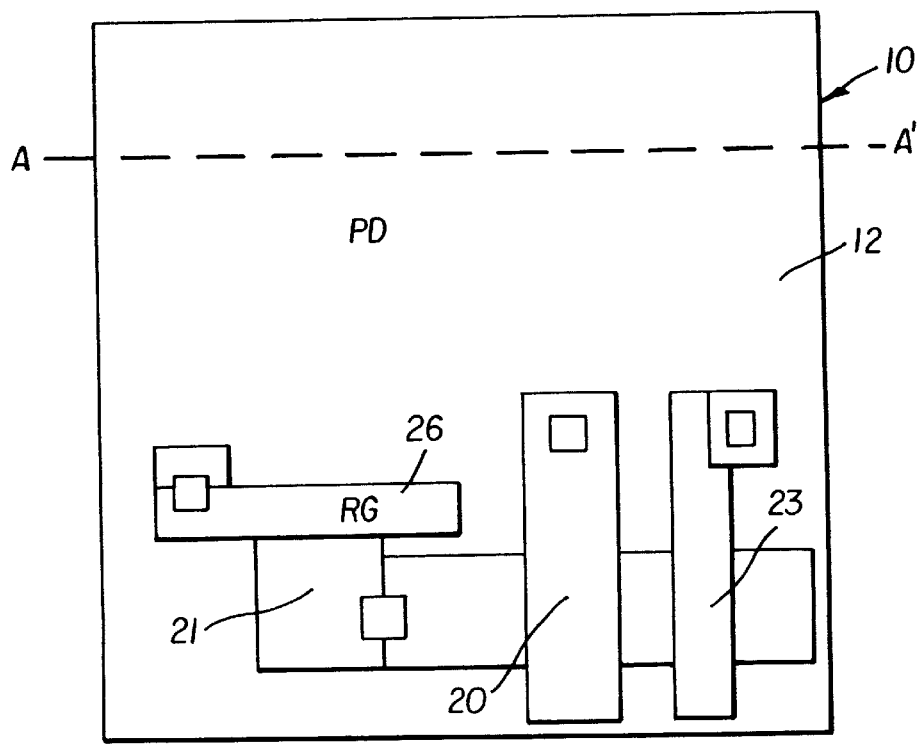
FIG. 2 is a schematic top view layout diagram of the pixel shown in FIG. 1.
Figure 3:
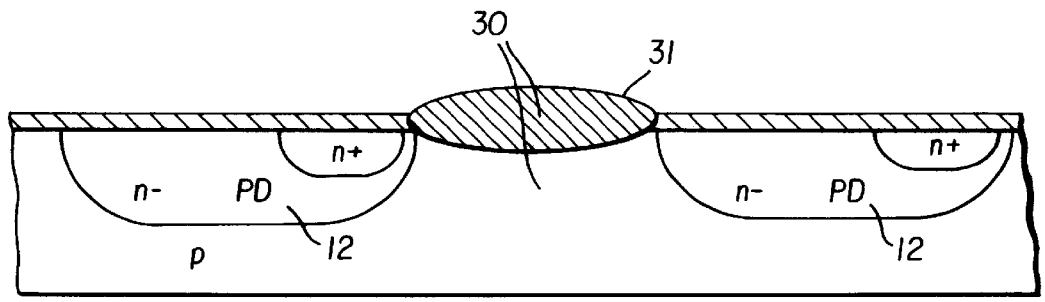
FIG. 3 is a schematic cross-sectional view of an array of pixels.
Figure 4:
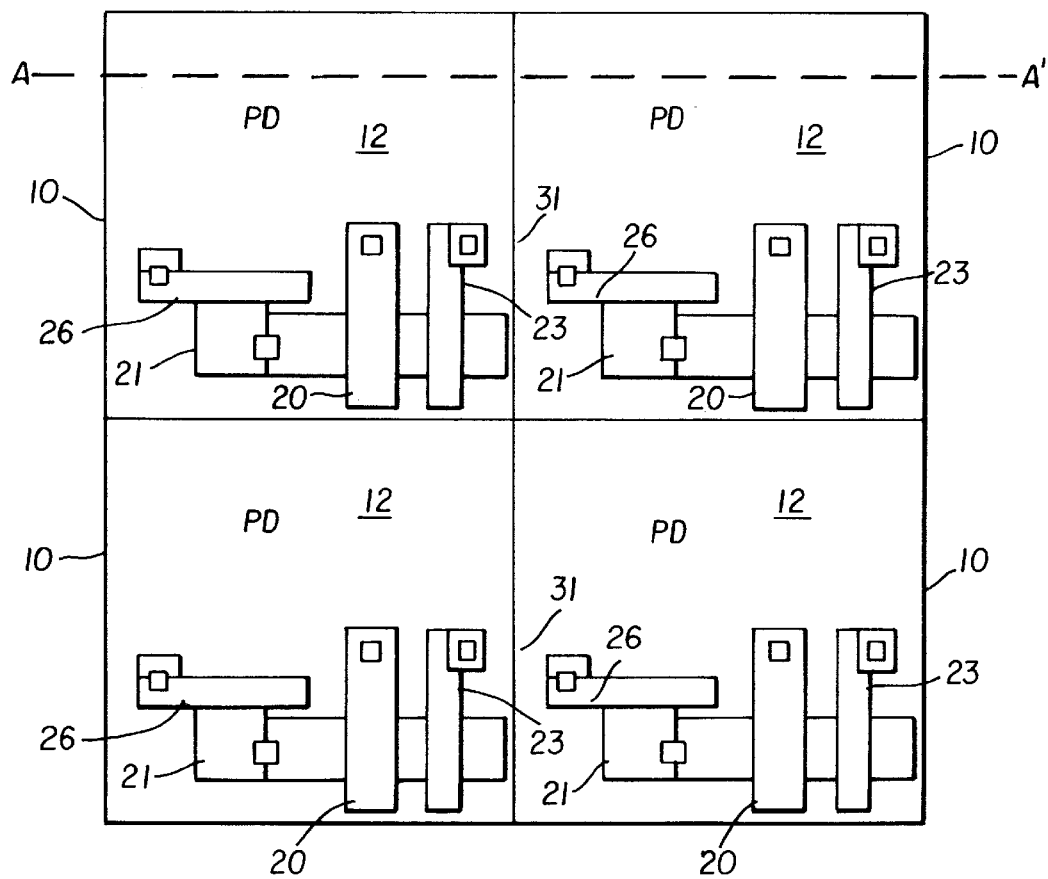
FIG. 4 is a schematic top view of an array of pixels.

The invention reduces pixel to pixel cross-talk and collects electrons thermally generated in isolation regions by providing scavenging diodes that are positioned between photodetectors and connected to a voltage supply. More specifically, FIG. 6 is similar to FIG. 4 except that the voltage supply 21 has been replaced with the combination voltage supply 21 and scavenging diode 40. This can also be seen in cross-sectional view in FIG. 5. In operation, the photoelectrons which occur outside the photodetector 12 will be drawn to the scavenging diodes as opposed to the photodetector cells 12.

The scavenging diodes 40 can have different sizes and shapes and can comprise multiple conductive elements as shown in FIG. 6. As would be known by one ordinarily skilled in the art given this disclosure, the scavenging diode can take on any necessary shape (and size) depending upon the arrangement of the photodetector cells 10 within the photodetector array, so long as the scavenging diode 40 is positioned between adjacent photodetectors 12. In addition, not every photodetector cell requires a scavenging diode. Once again, the arrangement is acceptable so long as the scavenging diode 40 is placed between the photodetectors 12.

There are generally hundreds of thousands of pixel cells within a standard array. Therefore, in a preferred embodiment, the interior photodetector cells of the array would all have the same shape and size scavenging diodes. The peripheral photodetector cells of the array could have unique scavenging diodes to accommodate for the arrangement of cells along the borders of the array.

The scavenging diode 40 can be conceptually considered part of the voltage source 21 or can be considered separate but connected to the voltage source 21, so long as there is an electrical connection between the voltage source 21 and the scavenging diode 40 which allows electrons gathered by the scavenging diode to be collected and drawn away from the photodetectors 12. Indeed, in a preferred embodiment, the voltage source 21 and the scavenging diode 40 comprise a continuous active area region doped by the same conductivity type as the voltage supply node.

Figure 5:
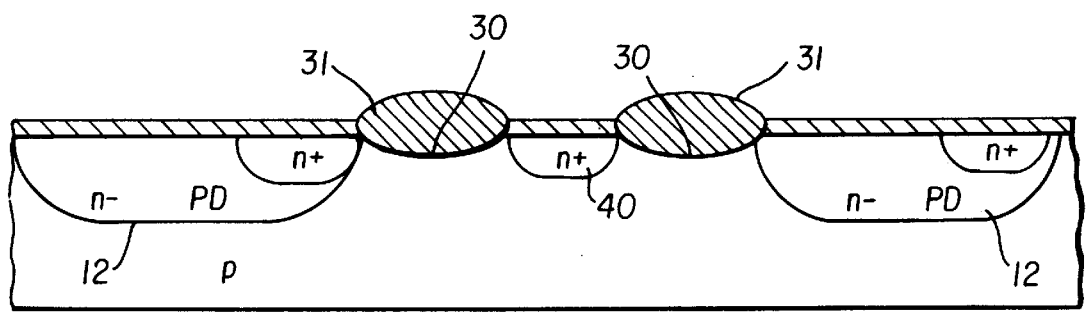
FIG. 5 is a schematic cross-sectional view of an array of pixels having scavenging diodes.
Figure 6:
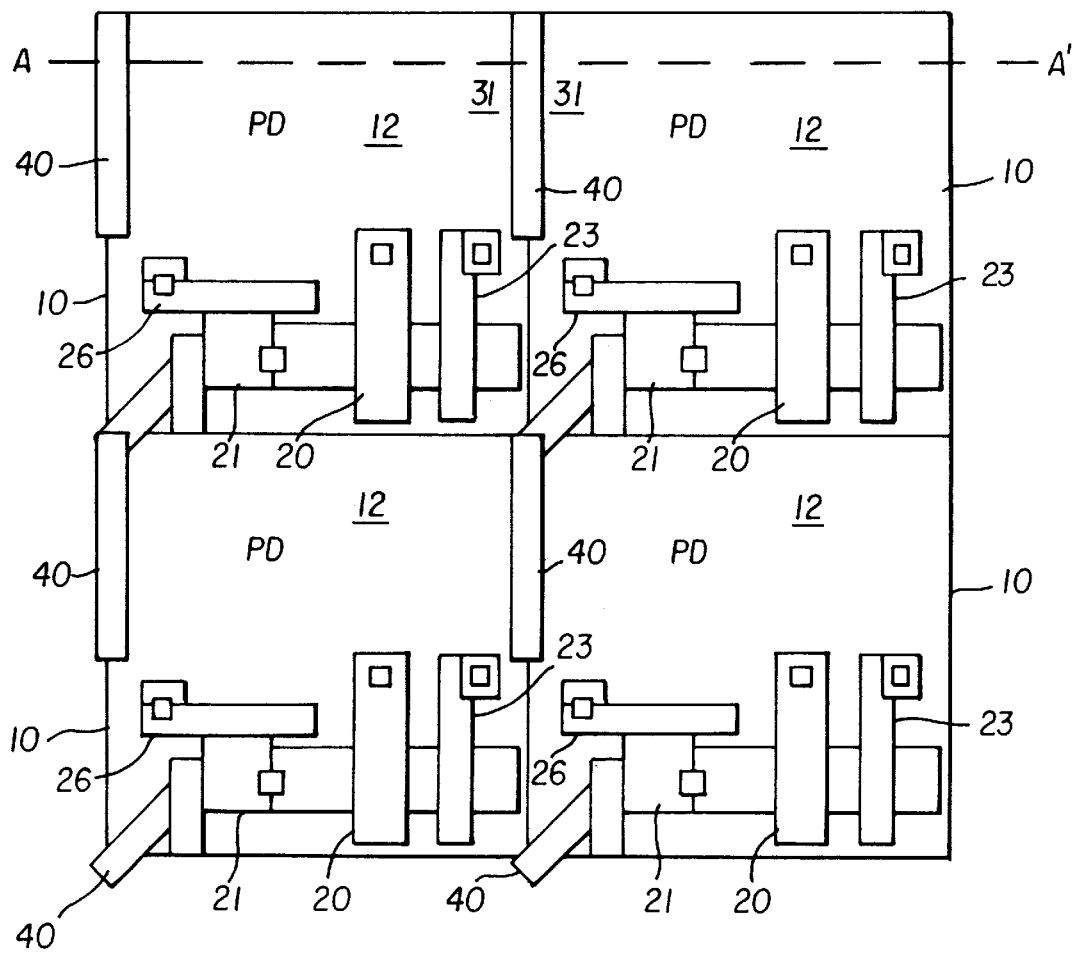
FIG. 6 is a schematic top view of an array of pixels having scavenging diodes.
Figure 7:
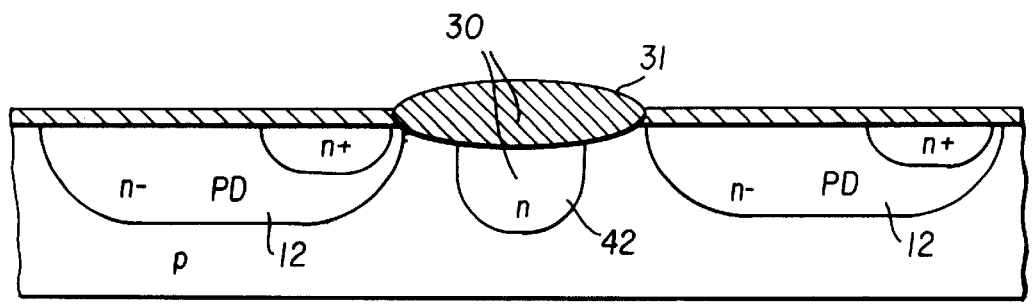
FIG. 7 is a schematic cross-sectional view of an array of pixels having scavenging diodes.

In an alternative embodiment shown in FIG. 7, the scavenging diodes 40 (e.g., n-type implants), are formed using well known techniques, so that a major portion of the scavenging diodes 42 is formed underneath the isolation regions 31 (as shown in FIG. 7), rather than in-between the isolation regions 31, (as shown in FIG. 5). This embodiment provides a smaller area requirement to implement the scavenging diodes 42.

Figure 8:
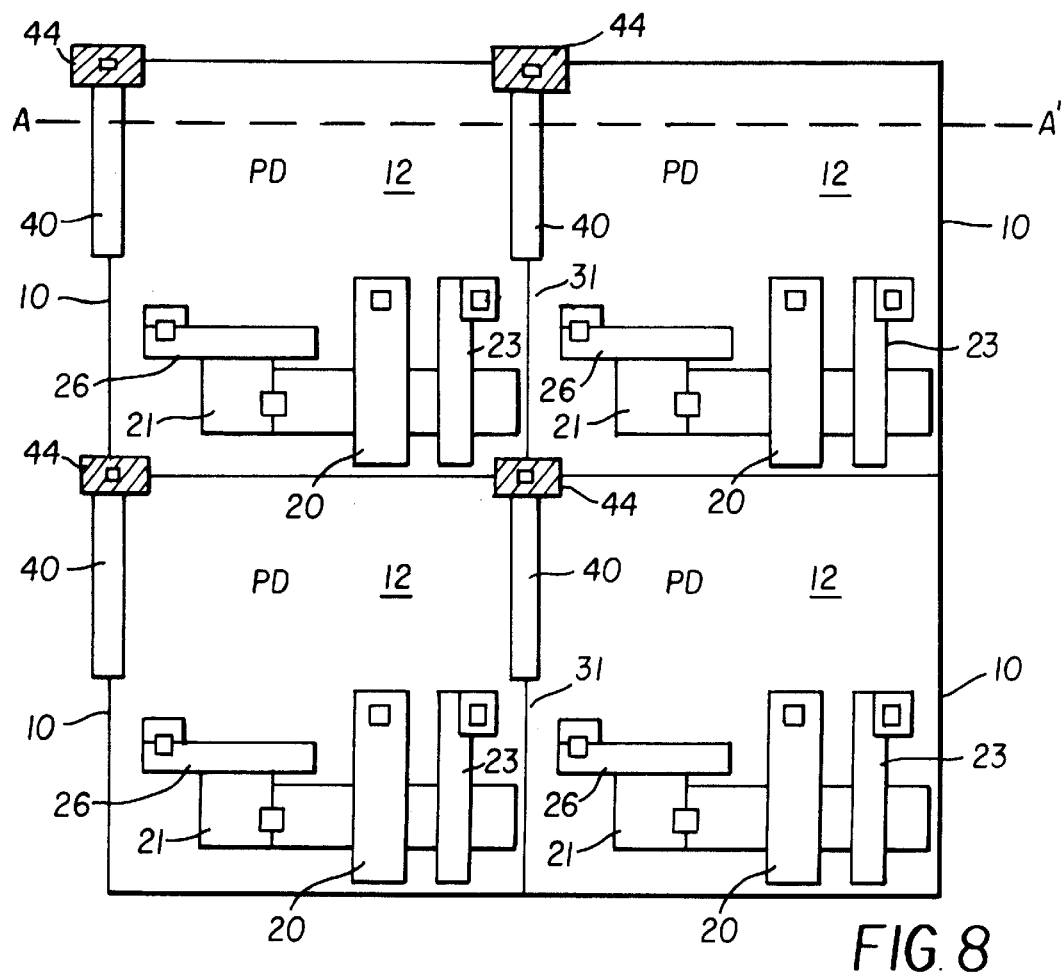
FIG. 8 is a schematic top view of an array of pixels having scavenging diodes.

In an additional embodiment shown in FIG. 8, the scavenging diodes 40 can be connected via an interconnect 44 to a separate voltage source rather than to voltage source 21. The separate voltage source can be any well-known voltage device and is not illustrated to not obscure the inventive structure. The separate scavenging voltage source connected to the interconnect 44 can be controlled separately to optimize reduction of cross-talk and dark current and quantum efficiency of the photodetector. As with the previous embodiments, the scavenging diode 40 shown in FIG. 8 can be positioned between the isolation regions 31 (FIG. 5) or below the isolation regions 31 (FIG. 7).

Figure 9:
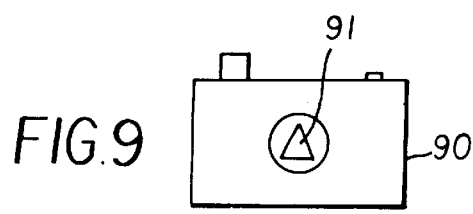
FIG. 9 is a schematic diagram of a camera or imaging system.

FIG. 9 illustrates a camera/imaging system 90 that includes the inventive photodetector 91 described above. The details of the imaging system 90 are well known to those ordinarily skilled in the art and are not included herein, so as not to unnecessarily obscure the salient features of the invention.

The invention is easily implemented in standard CMOS technology and does not require additional processing steps in that the invention merely changes the shape of the active area and implant masks used. Therefore, the invention does not add cost, complexity, or time considerations to the development of the pixel array.

This invention produces more isotropic color cross talk by placing the scavenging diode between adjacent photodetectors. The circuit components that are in the pixel at the bottom of each photodetector provide effective scavenging or cross-talk prevention in the vertical direction. In conventional devices the color cross-talk was anisotropic, (very little in the vertical direction, and substantial amounts in the horizontal direction ). This invention makes color cross-talk very low in both the vertical and horizontal directions.

The invention is different that conventional CCD arrays because CCD arrays do not contain scavenging diodes within the pixel array. Instead, conventional scavenging diodes are used to surround the entire array of pixels to prevent stray photoelectrons from outside of the array migrating or diffusing into the pixel array.

While the invention has been described in terms of preferred embodiments, those skilled in the art will recognize that the invention can be practiced with modification within the spirit and scope of the appended claims.

10 CMOS active pixel sensor cell
12 photodiode
14 reset transistor
16 source follower transistor
18 row-select transistor
20 source-follower
21 voltage supply
23 row select
26 reset gate
30 photoelectrons
31 isolation region
40 scavenging diode
42 scavenging diode
44 interconnect
90 camera/imaging system
91 photodetector array

What is claim is:

1. A complementary metal oxide semiconductor (CMOS) active pixel image sensor, comprising an array of pixels, at least one of said pixels comprising:
   a photodetector;
   active circuit components adapted to read signals from said photodetector;
   a voltage source supplying voltage to said circuit components; and
   a scavenging diode connected to said voltage source,
      wherein said scavenging diode prevents electrons outside said photodetector from migrating to said photodetector.

2. The CMOS active pixel image sensor in claim 1, wherein said scavenging diode is positioned adjacent said photodetector.

3. The CMOS active pixel image sensor in claim 1, wherein said photodetector is positioned adjacent sides and a top of each of said pixels and said active circuit components are positioned below said photodetector, wherein said scavenging diode is positioned along at least one of said sides of said pixels.

4. The CMOS active pixel image sensor in claim 1, wherein said scavenging diode is positioned directly between adjacent photodetectors.

5. The CMOS active pixel image sensor in claim 1, wherein said voltage source and said scavenging diode comprise a continuous conductor.

6. The CMOS active pixel image sensor in claim 1, further comprising an isolation region between adjacent pixels, wherein said scavenging diode is positioned below said isolation region.

7. A complementary metal oxide semiconductor (CMOS) active pixel image sensor, comprising an array of pixels, at least one of said pixels comprising:
   a photodetector;
   active circuit components adapted to read signals from said photodetector;
   a first voltage source supplying voltage to said circuit components; and
   a scavenging diode connected to a second voltage source, separate from said first voltage source,
      wherein said scavenging diode prevents electrons outside said photodetector from migrating to said photodetector.

8. The CMOS active pixel image sensor in claim 7, wherein said scavenging diode is positioned adjacent said photodetector.

9. The CMOS active pixel image sensor in claim 7, wherein said photodetector is positioned adjacent sides and a top of each of said pixels and said active circuit components are positioned below said photodetector, wherein said scavenging diode is positioned along at least one of said sides of said pixels.

10. The CMOS active pixel image sensor in claim 7, wherein said scavenging diode is positioned directly between adjacent photodetectors.

11. The CMOS active pixel image sensor in claim 7, further comprising an isolation region between adjacent pixels, wherein said scavenging diode is positioned below said isolation region.

12. A camera/imaging system having a complementary metal oxide semiconductor (CMOS) active pixel image sensor, comprising an array of pixels, at least one of said pixels comprising:
- a photodetector;
- active circuit components adapted to read signals from said photodetector;
- a voltage source supplying voltage to said circuit components; and
- a scavenging diode connected to said voltage source,
    wherein said scavenging diode prevents electrons outside said photodetector from migrating to said photodetector.

13. The camera/imaging system in claim 12, wherein said scavenging diode is positioned adjacent said photodetector.

14. The camera/imaging system in claim 12, wherein said photodetector is positioned adjacent sides and a top of each of said image sensors and said active circuit components are positioned below said photodetector, wherein said scavenging diode is positioned along at least one of said sides of said pixels.

15. The camera/imaging system in claim 12, wherein said scavenging diode is positioned directly between adjacent photodetectors.

16. The camera/imaging system in claim 12, wherein said voltage source and said scavenging diode comprise a continuous conductor.

17. A camera/imaging system having a complementary metal oxide semiconductor (CMOS) active pixel image sensor, comprising an array of pixels, at least one of said pixels comprising:
- a photodetector;
- active circuit components adapted to read signals from said photodetector;
- a first voltage source supplying voltage to said circuit components; and
- a scavenging diode connected to a second voltage source, separate from said first voltage source,
    wherein said scavenging diode prevents electrons outside said photodetector from migrating to said photodetector.

18. The camera/imaging system in claim 17, wherein said scavenging diode is positioned adjacent said photodetector.

19. The camera/imaging system in claim 17, wherein said photodetector is positioned adjacent sides and a top of each of said pixels and said active circuit components are positioned below said photodetector, wherein said scavenging diode is positioned along at least one of said sides of said pixels.

20. The camera/imaging system in claim 17, wherein said scavenging diode is positioned directly between adjacent photodetectors.

21. The camera/imaging system in claim 17, further comprising an isolation region between adjacent pixels, wherein said scavenging diode is positioned below said isolation region.

22. A complementary metal oxide semiconductor (CMOS) active pixel image sensor, comprising an array of pixels, at least one of said pixels comprising:
- a substrate having a first conductivity;
- a photodetector region within said substrate having a second conductivity; and
- a scavenging diode region within said substrate having said second conductivity, said scavenging diode region being positioned and between adjacent photodetector regions, such that said scavenging diode prevents electrons outside said photodetector region from migrating to said photodetector region.

23. The CMOS active pixel image sensor in claim 22, wherein said scavenging diode region is positioned directly between said adjacent photodetector regions.

24. The CMOS active pixel image sensor in claim 22, further comprising a voltage source connected to said scavenging diode region.

25. The CMOS active pixel image sensor in claim 22, further comprising isolation regions between said adjacent photodetector regions, wherein said scavenging diode is positioned between said isolation regions.

26. The CMOS active pixel image sensor in claim 22, further comprising an isolation region between said adjacent photodetector regions, wherein said scavenging diode is positioned below said isolation region.

* * * * *